United States Patent
Natarajan et al.

(10) Patent No.: US 7,738,158 B2
(45) Date of Patent: Jun. 15, 2010

(54) ELECTROMECHANICAL DEVICE TREATMENT WITH WATER VAPOR

(75) Inventors: Bangalore R. Natarajan, Cupertino, CA (US); Kasra Khazeni, San Jose, CA (US); David Heald, Solvang, CA (US); Rihui He, San Jose, CA (US); Sriram Akella, San Jose, CA (US); Evgeni Gousev, Saratoga, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 186 days.

(21) Appl. No.: 12/163,660

(22) Filed: Jun. 27, 2008

(65) Prior Publication Data
US 2009/0002804 A1 Jan. 1, 2009

Related U.S. Application Data

(60) Provisional application No. 60/947,353, filed on Jun. 29, 2007.

(51) Int. Cl.
G02B 26/00 (2006.01)
G02F 1/03 (2006.01)

(52) U.S. Cl. .................... 359/290; 359/247

(58) Field of Classification Search .......... 359/199.4, 359/200.8, 212.1, 224.1, 247, 290–292, 295, 359/302
See application file for complete search history.

(56) References Cited

U.S. PATENT DOCUMENTS

| | | | |
|---|---|---|---|
| 5,061,049 A | 10/1991 | Hornbeck | |
| 5,096,279 A | 3/1992 | Hornbeck et al. | |
| 5,331,454 A | 7/1994 | Hornbeck | |
| 5,411,769 A | 5/1995 | Hornbeck | |
| 5,459,610 A | 10/1995 | Bloom et al. | |
| 5,559,358 A | 9/1996 | Burns et al. | |
| 5,578,976 A | 11/1996 | Yao | |
| 5,602,671 A | 2/1997 | Hornbeck | |
| 5,610,438 A | 3/1997 | Wallace et al. | |
| 5,665,997 A | 9/1997 | Weaver et al. | |
| 5,824,608 A | 10/1998 | Gotoh et al. | |

(Continued)

FOREIGN PATENT DOCUMENTS

CH 680534 9/1992

(Continued)

OTHER PUBLICATIONS

Maboudian, et al., Self-assembled monolayers as anti-stiction coatings for MEMS: characteristics and recent developments, Sensors and Actuators 82 (2000) 219-223.

(Continued)

*Primary Examiner*—William C Choi
(74) *Attorney, Agent, or Firm*—Knobbe, Martens, Olson & Bear, LLP

(57) ABSTRACT

Methods, devices, and systems provide MEMS devices exhibiting at least one of reduced stiction, reduced hydrophilicity, or reduced variability of certain electrical characteristics using MEMS devices treated with water vapor. The treatment is believed to form one or more passivated surfaces on the interior and/or exterior of the MEMS devices. Relatively gentle temperature and pressure conditions ensure modification of surface chemistry without excessive water absorption after removal of sacrificial material to release the MEMS devices.

31 Claims, 14 Drawing Sheets

U.S. PATENT DOCUMENTS

| | | | |
|---|---|---|---|
| 5,978,127 A | 11/1999 | Berg |
| 6,040,937 A | 3/2000 | Miles |
| 6,046,840 A | 4/2000 | Huibers |
| 6,097,145 A | 8/2000 | Kastalsky et al. |
| 6,099,132 A | 8/2000 | Kaeriyama |
| 6,172,797 B1 | 1/2001 | Huibers |
| 6,195,196 B1 | 2/2001 | Kimura et al. |
| 6,608,268 B1 | 8/2003 | Goldsmith |
| 6,624,944 B1 | 9/2003 | Wallace et al. |
| 6,635,919 B1 | 10/2003 | Melendez et al. |
| 6,674,562 B1 | 1/2004 | Miles |
| 6,710,908 B2 | 3/2004 | Miles et al. |
| 6,787,968 B2 | 9/2004 | Tai et al. |
| 6,791,441 B2 | 9/2004 | Pillans et al. |
| 6,969,635 B2 | 11/2005 | Patel et al. |
| 7,002,441 B2 | 2/2006 | Pillans et al. |
| 7,072,093 B2 | 7/2006 | Piehl et al. |
| 7,110,158 B2 | 9/2006 | Miles |
| 7,123,216 B1 | 10/2006 | Miles |
| 7,327,510 B2 | 2/2008 | Cummings et al. |
| 2002/0015215 A1 | 2/2002 | Miles |
| 2003/0080082 A1 | 5/2003 | Chinn et al. |
| 2003/0231373 A1 | 12/2003 | Kowarz et al. |
| 2004/0033372 A1 | 2/2004 | Mueller et al. |
| 2004/0051929 A1 | 3/2004 | Sampsell et al. |
| 2004/0100677 A1 | 5/2004 | Huibers et al. |
| 2004/0150939 A1 | 8/2004 | Huff |
| 2004/0217919 A1 | 11/2004 | Pichl et al. |
| 2005/0012577 A1 | 1/2005 | Pillans et al. |
| 2005/0012975 A1 | 1/2005 | George et al. |
| 2006/0024880 A1 | 2/2006 | Chui et al. |
| 2006/0113618 A1 | 6/2006 | Reboa |
| 2007/0247696 A1 | 10/2007 | Sasagawa et al. |
| 2008/0218843 A1 | 9/2008 | Sasagawa et al. |
| 2008/0311690 A1 | 12/2008 | Tu et al. |

FOREIGN PATENT DOCUMENTS

| | | |
|---|---|---|
| EP | 1 745 864 | 1/2007 |
| FR | 2824643 | 10/1999 |
| FR | 2 839 919 | 11/2003 |
| JP | 11211999 | 8/1999 |
| JP | 11-263012 | 9/1999 |
| JP | 2000-075223 | 3/2000 |
| JP | 2002-355800 | 12/2002 |
| JP | 2003-195189 | 7/2003 |
| WO | WO 03/031319 | 4/2003 |
| WO | WO 03/046508 | 6/2003 |
| WO | WO 04/000717 | 12/2003 |
| WO | WO 2005/124869 | 12/2005 |
| WO | WO 2006/026162 | 3/2006 |
| WO | WO 2007/060416 | 5/2007 |

OTHER PUBLICATIONS

International Search Report and Written Opinion received in PCT Application No. PCT/US2008/068655 dated Jan. 20, 2009.

ISR and WO for PCT/US08/068655, filed Jun. 27, 2008.

Maboudian, et al. Critical Review: Adhesion in Surface Micromechanical Structures: J. Vac. Sci Techno. B 15(1) Jan./Feb. 1997, pp. 1-20.

Matsumoto et al., Novel prevention method of stiction using silicon anodization for SOI structure, Sensors and Actuators, 72:2(153-159) Jan. 19, 1999.

Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).

Xactix Xetch X# Specifications, http:--www.xactix.com-Xtech X3specs.htm, Jan. 5, 2005.

Xactix Xetch Product Information.

IPRP for PCT/US08/068655, filed Jun. 27, 2008.

Jerman et al., Miniature fabry-perot interferometers micromachined in silicon for use in optical fiber wdm systems, Proceedings of the International Conference on Solid State Sensors And Actuators, IEEE, vol. Conf. 6, Jun. 24, 1991, pp. 372-375.

ELECTROMECHANICAL DEVICE TREATMENT WITH WATER VAPOR

CROSS-REFERENCE TO RELATED APPLICATIONS

This application claims priority under 35 U.S.C. §119(e) to U.S. Provisional Application Ser. No. 60/947,353, filed on Jun. 29, 2007, titled "ELECTROMECHANICAL DEVICE TREATMENT WITH WATER VAPOR", the disclosure of which is hereby expressly incorporated by reference in its entirety.

BACKGROUND OF THE INVENTION

1. Technical Field

This application is generally related to microelectromechanical systems (MEMS) devices, and more particularly, to MEMS devices with cavities and methods for manufacturing the same.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

Methods, devices, and systems provide MEMS devices exhibiting at least one of reduced stiction, reduced hydrophilicity, or reduced variability of certain electrical characteristics using MEMS devices treated with water vapor. The treatment is believed to form one or more passivated surfaces on the interior and/or exterior of the MEMS devices. Embodiments of treated MEMS devices exhibit one of reduced stiction, reduced hydrophilicity, and reduced variation of certain electrical characteristics over multiple actuation cycles.

Some embodiments provide a method for treating an electromechanical device, the method comprising: treating the electromechanical device with water vapor, as well as an electromechanical device manufactured by this method.

In some embodiments, treating the electromechanical device comprises treating at least one of a microelectromechanical systems (MEMS) and a nanoelectromechanical systems (NEMS). In some embodiments, treating the electromechanical device comprises treating an array comprising a plurality of the electromechanical devices. In some embodiments, the treating the electromechanical device comprises reducing stiction in the electromechanical device. In some embodiments, treating the electromechanical device comprises stabilizing an offset voltage in the electromechanical device. In some embodiments, treating the electromechanical device comprises reducing variability of an actuation voltage in a plurality of the electromechanical devices. In some embodiments, treating the electromechanical device comprises reducing variability of a release voltage in a plurality of the electromechanical devices. In some embodiments, treating the electromechanical device comprises reducing variability of a hysteresis window in a plurality of the electromechanical devices.

In some embodiments, treating the electromechanical device comprises increasing a hydrophobicity of at least one surface of the electromechanical device. In some embodiments, increasing a hydrophobicity of at least one surface comprises increasing a contact angle of a droplet of water of the at least one surface to at least about 60°. In some embodiments, increasing a hydrophobicity of at least one surface comprises increasing the hydrophobicity of a surface comprising at least one of a metal surface and a metal oxide surface. In some embodiments, increasing a hydrophobicity of at least one surface comprises increasing the hydrophobicity of a surface of a cavity.

In some embodiments, treating the electromechanical device with water vapor comprises exposing the electromechanical device to an environment of from about 10% to about 100% relative humidity. In some embodiments, treating the electromechanical device with water vapor comprises exposing the electromechanical device to an environment of from about 50% to about 90% relative humidity. In some embodiments, treating the electromechanical device with water vapor comprises exposing the electromechanical device to an environment of below 85% relative humidity, e.g., from about 55% to about 75% relative humidity, or about 60% to about 70% relative humidity. In some embodiments, treating the electromechanical device with water vapor comprises treating the electromechanical device with water vapor for at least 1 min. In some embodiments, treating the electromechanical device with water vapor comprises treating the electromechanical device with water vapor for less than 2 hours. In some embodiments, treating the electromechanical device with water vapor comprises treating the electromechanical device with water vapor for 30 minutes to 12 hours, or 2 to 6 hours, or 4 hours. In some embodiments, treating the electromechanical device with water vapor comprises treating the electromechanical device with pulses of water vapor.

Some embodiments further comprise etching a cavity in the electromechanical device.

In some embodiments, etching the cavity comprises etching the cavity in a dry etch. In some embodiments, etching the cavity in a dry etch comprises etching the cavity using an etchant comprising a fluorine-based etchant. In some embodiments, no water vapor is present during the etch. In some embodiments, the etchant comprises $XeF_2$. In some embodiments, etching the cavity comprises etching the cavity in a chamber that is connected to a load lock.

Some embodiments further comprise heating the electromechanical device. In some embodiments, heating the electromechanical device comprises heating the electromechanical device from about 25° C. to about 175° C. In some embodiments, heating the electromechanical device comprises heating the electromechanical device from about 50° C. to about 120° C. In some embodiments, heating the electromechanical device comprises heating the electromechanical device from about 50° C. to about 100° C. In some embodiments, heating the electromechanical device comprises heating the electromechanical device to a temperature below 100° C. In some embodiments, heating the electromechanical device comprises heating the electromechanical device from about 60° C. to about 70° C.

Some embodiments further comprise heat treating the electromechanical device before treating the electromechanical device with water vapor.

Some embodiments further comprise depositing a layer on the electromechanical device after treating the electromechanical device with water vapor.

Some embodiments provide an apparatus comprising a water-vapor passivated MEMS device, wherein the water-vapor passivated MEMS device comprises: a first layer comprising a partial reflector; a reflective layer movable relative to the first layer; and a cavity, an interior of which is defined by the first layer and the reflective layer, wherein at least a portion of a surface of the cavity comprises a water-vapor passivated surface.

Some embodiments further comprise an upper surface exterior of the cavity, wherein the upper surface comprises a water-vapor passivated surface.

In some embodiments, a contact angle of the at least a portion of the surface of the cavity is at least about 60°. In some embodiments, the at least a portion of the surface of the cavity comprises a metal surface.

Some embodiments further comprise: a display; a processor that is configured to communicate with said display, said processor being configured to process image data; and a memory device that is configured to communicate with said processor. Some embodiments further comprise a driver circuit configured to send at least one signal to the display. Some embodiments further comprise a controller configured to send at least a portion of the image data to the driver circuit.

Some embodiments further comprise an image source module configured to send said image data to said processor. In some embodiments, the image source module comprises at least one of a receiver, transceiver, and transmitter.

Some embodiments further comprise an input device configured to receive input data and to communicate said input data to said processor.

Some embodiments provide a method for reducing stiction in a microelectromechanical systems (MEMS) device, the method comprising: treating a first surface of a MEMS device with water vapor, wherein the first surface and a second surface of the MEMS device are relatively movable, are operable to contact each other, and are susceptible to stiction.

In some embodiments, a method for treating an electromechanical device comprises providing an electromechanical device having a surface that defines at least a portion of a cavity, the surface being exposed by removing a sacrificial material and treating the electromechanical device such that surface chemistry of the surface is modified to be less susceptible to stiction.

In some embodiments, an apparatus comprises a water-vapor passivated MEMS device, the water-vapor passivated MEMS device comprising a first layer comprising a partial reflector, a reflective layer movable relative to the first layer, and a cavity, an interior of which is defined by the first layer and the reflective layer, wherein at least a portion of a surface of the cavity is water-vapor passivated after a sacrificial removal process.

In some embodiments, a method for reducing stiction in a microelectromechanical systems (MEMS) device comprises removing a sacrificial material from a MEMS device, heating the MEMS device after removing a sacrificial material from, and exposing and treating the MEMS device with water vapor after heating.

DETAILED DESCRIPTION OF SOME PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g. video) or stationary (e.g. still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g. odometer display, etc.), cockpit controls and/or displays, display of camera views (e.g. display of a rear view camera in a vehicle), electronic photographs, electronic billboards or signs, projectors, architectural structures, packaging, and aesthetic structures (e.g. display of images on a piece of jewelry). MEMS devices of similar structure to those described herein can also be used in non-display applications such as in electronic switching devices.

Embodiments of MEMS devices, including some interferometric modulators, are susceptible to stiction. Some embodiments also comprise one or more hydrophilic surfaces and/or components. Exposure of some of these embodiments of MEMS devices to water, either in the vapor or condensed phase can lead to device failure. Accordingly, MEMS devices susceptible to water are often hermetically sealed in packages that prevent or minimize contact with the external environment, and are often packaged with a desiccant to further prevent contact with moisture. Some embodiments of electromechanical MEMS device exhibit variation in certain electrical characteristics related to the operation of the MEMS device. Embodiments of MEMS devices treated with water vapor, as described below, exhibit at least one of reduced stiction, reduced hydrophilicity, and reduced variation in certain electrical characteristics.

Figure 1:
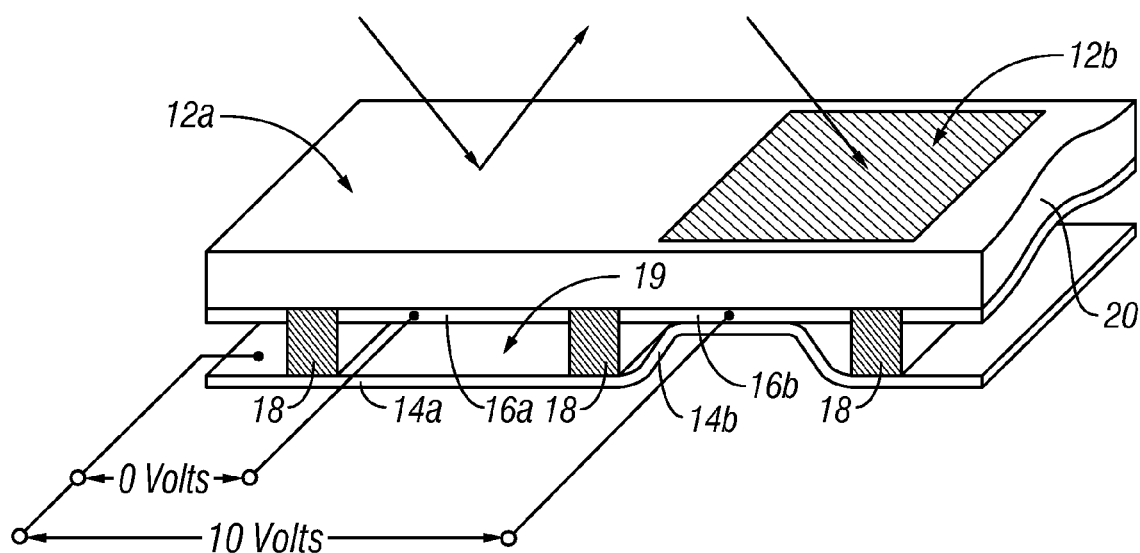
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in FIG. 1) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
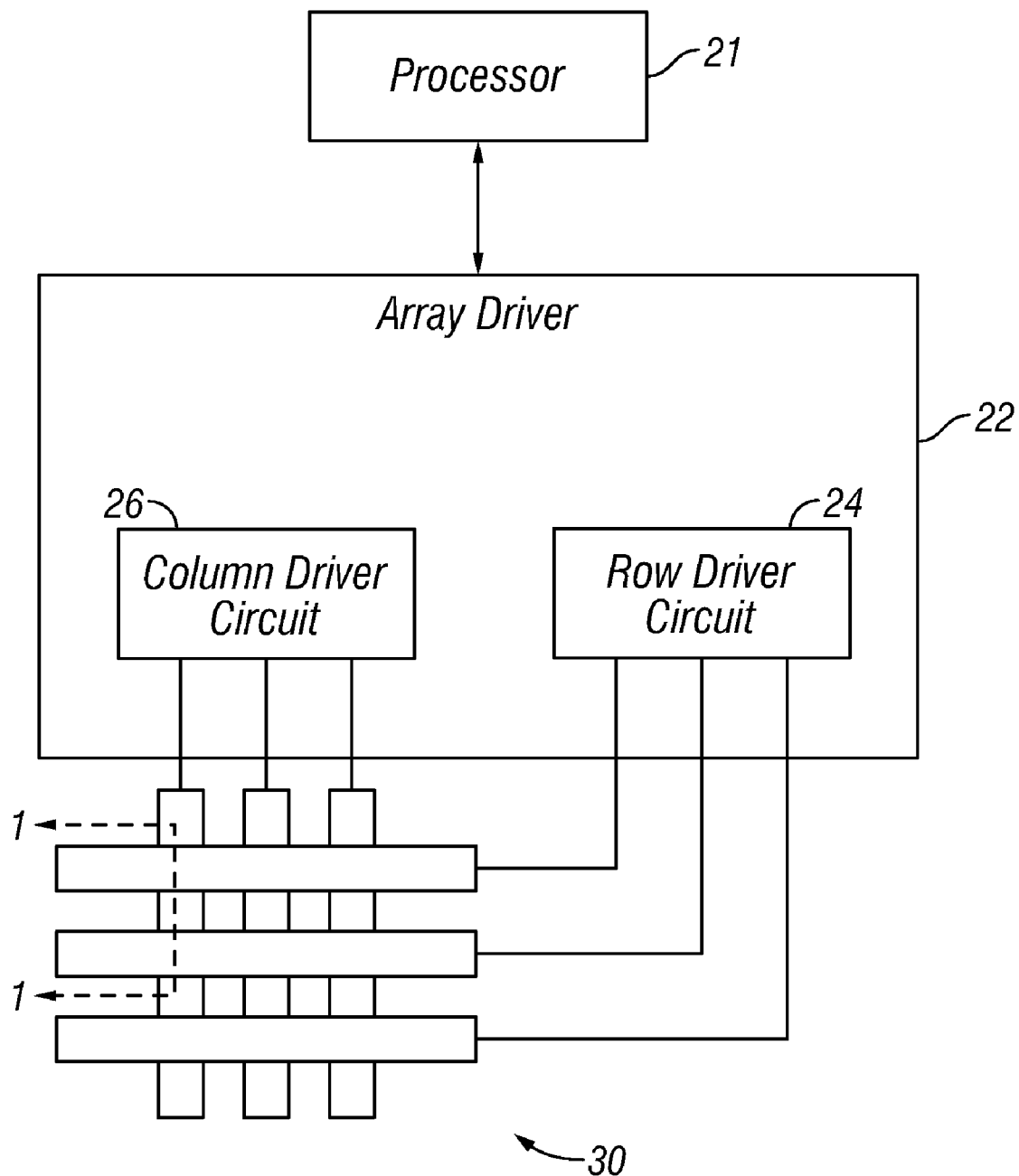
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
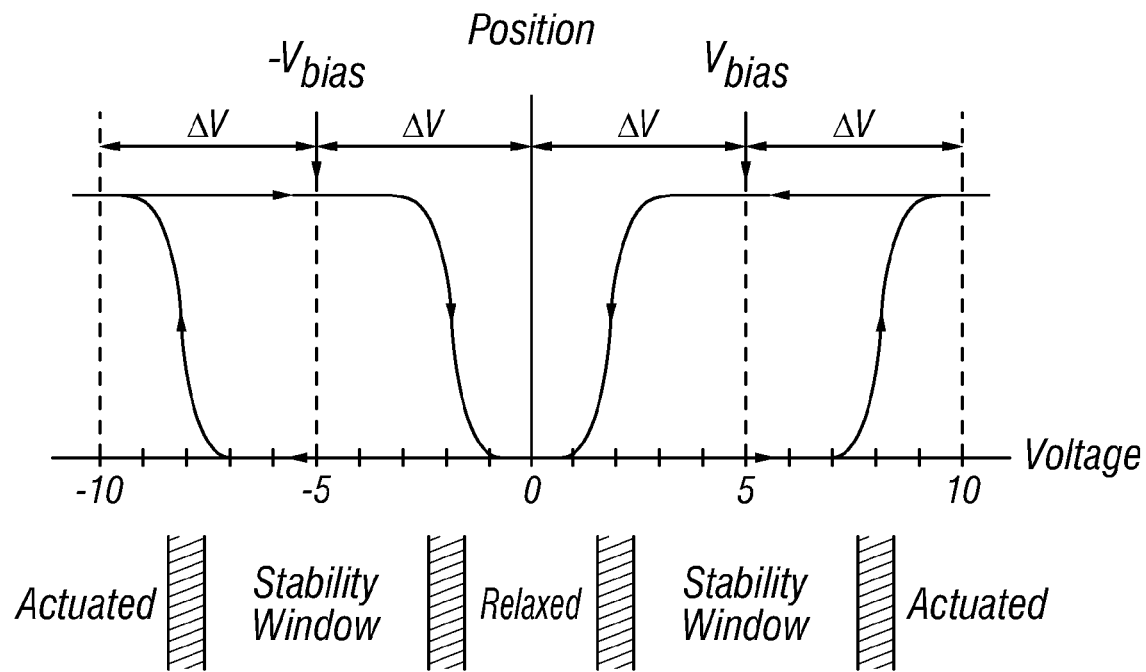
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
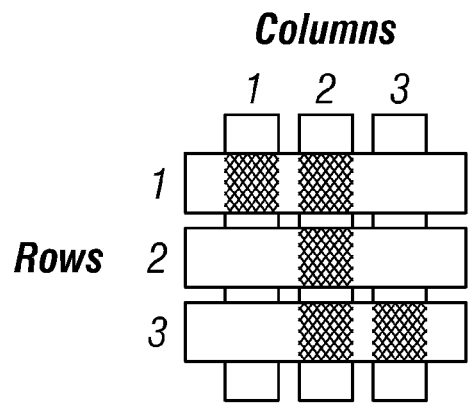
FIG. 5A illustrates one exemplary frame of display data in the 3×3 interferometric modulator display of FIG. 2.
Figure 5B:
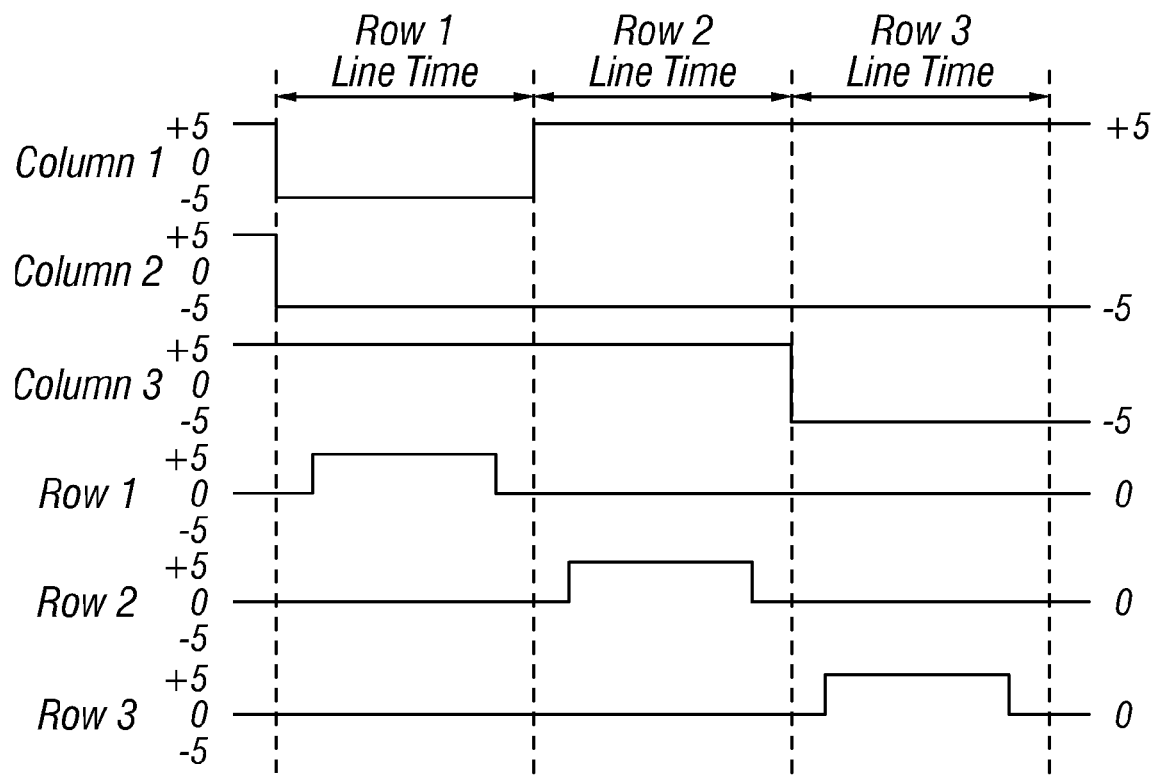
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
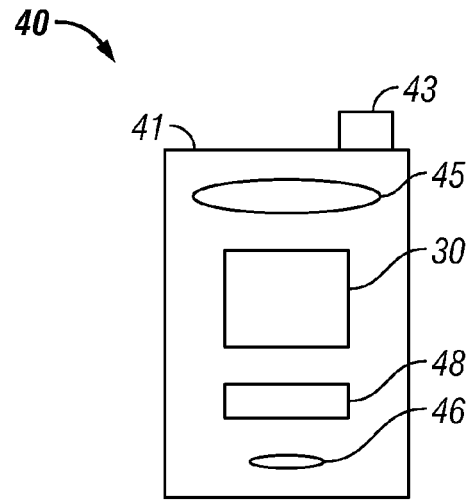
FIGS. 6A and 6B are system block diagrams illustrating an embodiment of a visual display device comprising a plurality of interferometric modulators.
Figure 6B:
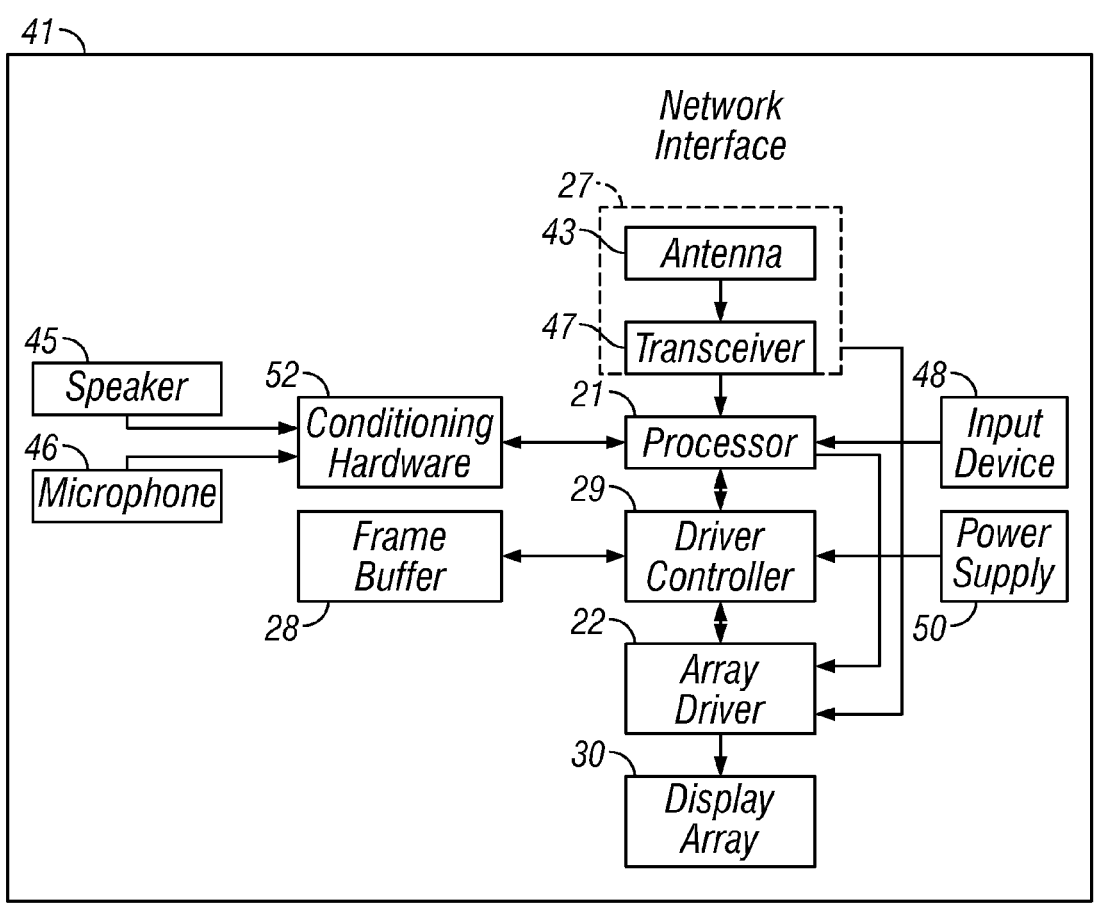

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a memory device such as a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g. an interferometric modulator controller). In another embodiment, the array driver 22 is a conventional driver or a bi-stable display driver (e.g. an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
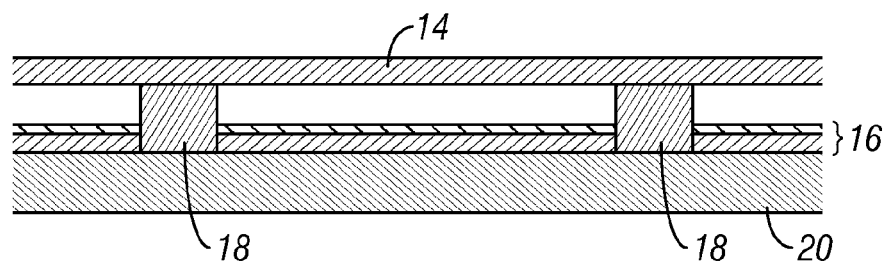
FIG. 7A is a cross section of the device of FIG. 1.
Figure 7B:
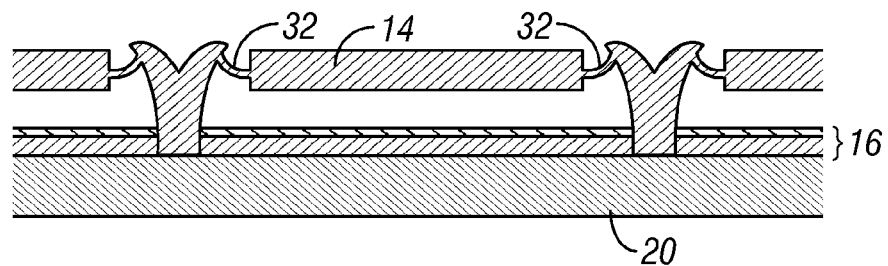
FIG. 7B is a cross section of an alternative embodiment of an interferometric modulator.
Figure 7C:
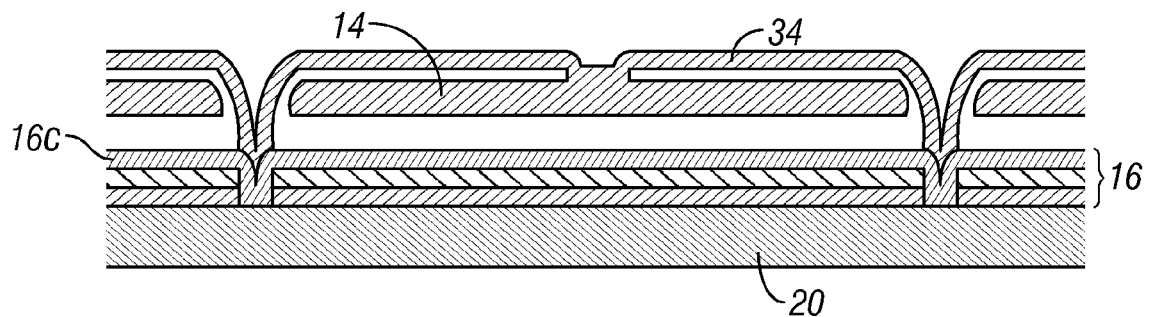
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections can take the form of continuous walls and/or individual posts. For example, parallel rails can support crossing rows of deformable layer 34 materials, thus defining columns of pixels in trenches and/or cavities between the rails. Additional support posts within each cavity can serve to stiffen the deformable layer 34 and prevent sagging in the relaxed position.

Figure 7D:
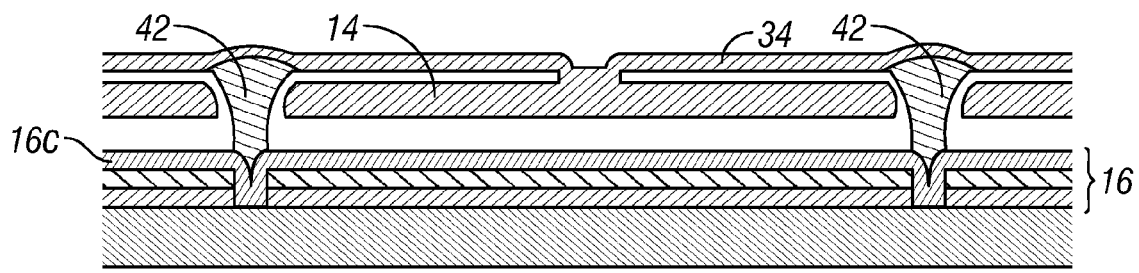
FIG. 7D is a cross section of yet another alternative embodiment of an interferometric modulator.
Figure 7E:
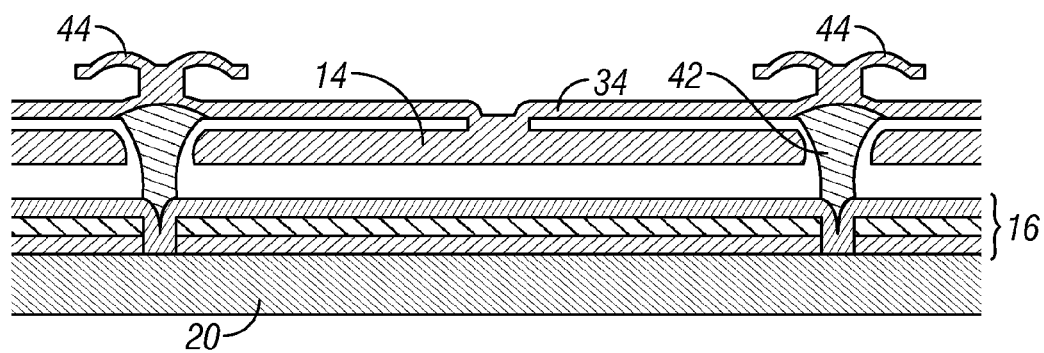
FIG. 7E is a cross section of an additional alternative embodiment of an interferometric modulator.

The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. Support post plugs or other support structures can be formed of a silicon oxynitride ($SiO_xN_y$). The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIGS. 7A-7E, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties. Those skilled in the art will understand that in some embodiments, for example, the embodiments, illustrated in FIGS. 7A and 7B, the movable reflective layer 14 also acts as a deformable layer forming, in essence, an integrated movable reflective layer and deformable layer.

Figure 8A:
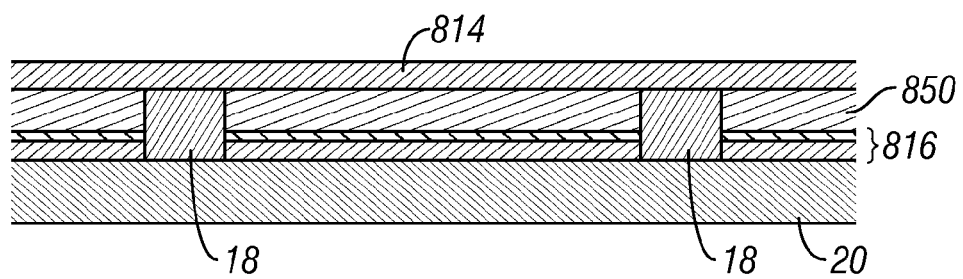
FIGS. 8A-8E, illustrate embodiments of unreleased interferometric modulators corresponding to the released interferometric modulators illustrated in FIGS. 7A-7E, respectively.
Figure 8B:
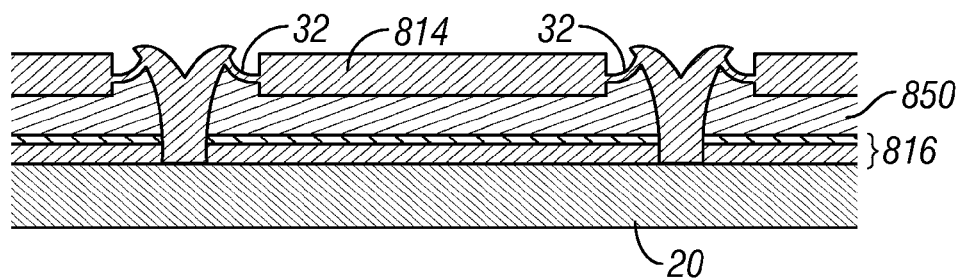
Figure 8C:
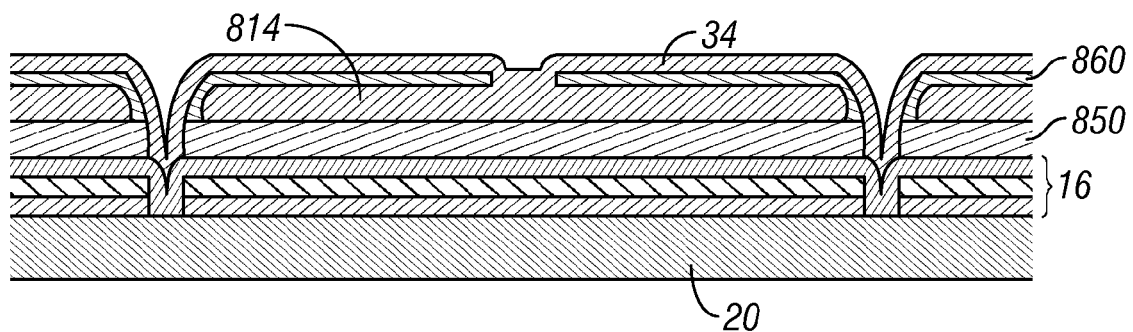
Figure 8D:
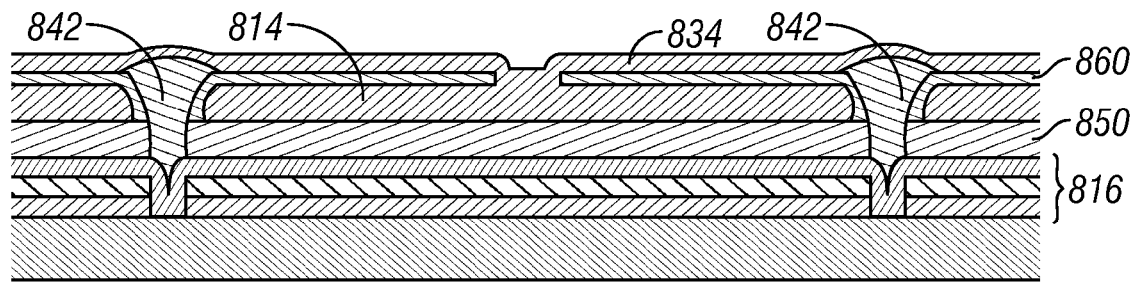
Figure 8E:
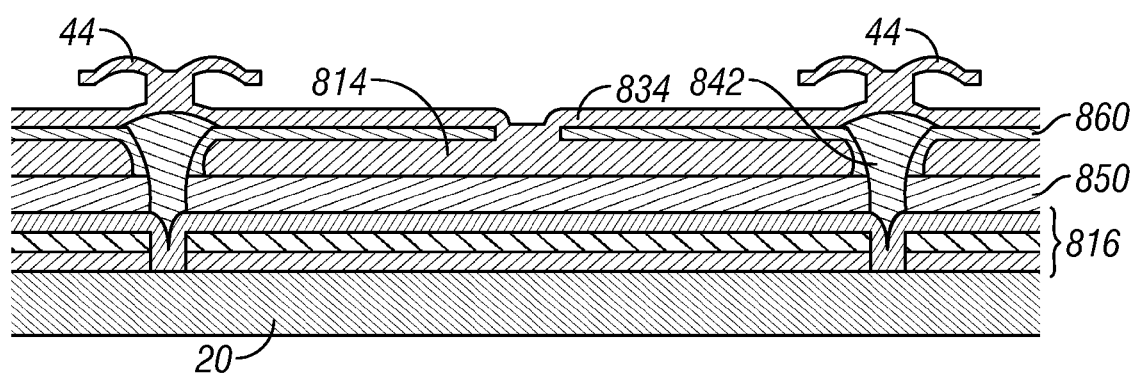

Embodiments of MEMS devices comprising movable components or elements are fabricated by a method in which a one or more sacrificial materials are removed or etched from a precursor structure, thereby creating one or more cavities or openings in the finished MEMS devices. Because such an etching step releases movable components from locked configurations in the precursor MEMS device, such an etching step may be referred to herein as a "release etch," and the resulting MEMS device may be referred to as a "released" MEMS device. Accordingly, the precursor MEMS device may also be referred to as an "unreleased" MEMS device. Sacrificial structures comprising sacrificial materials serve as placeholders in the manufacture of the MEMS devices, for example, as patterned layers defining one or more voids, openings, and/or cavities in a MEMS device. In particular, for electrostatic MEMS devices, sacrificial structures formed between stationary electrodes and movable electrodes occupy volumes that form cavities in the finished device. For example, FIGS. 8A-8E, illustrate embodiments of unreleased interferometric modulator MEMS devices corresponding to the released interferometric modulators illustrated in FIGS. 7A-7E, respectively. The unreleased interferometric modulators 800 comprise a substrate 820 on which is formed an optical stack 816. A first sacrificial structure 850 is formed on the optical stack 816. A reflective layer 814 is formed on the sacrificial structure 850 and on support structures 818 that extend through the sacrificial structure 850. In the embodiments illustrated in FIGS. 8C-8E, a second sacrificial structure 860 is formed over the reflective layer 814, which is suspended from a deformable layer 834. In FIGS. 8A and 8B, the layer 814 represents both a deformable layer and a movable electrode or mirror. In FIGS. 8C-8E, the deformable layer 834 and movable electrode or mirror 814 are separate structures.

In some embodiments, the release etch comprises exposing the unreleased interferometric modulators to one or more etchants that selectively etch the first sacrificial structure 850 and, if present, the second sacrificial structure 860, thereby forming the cavities in the interferometric modulators illustrated in FIGS. 7A-7E, respectively, thereby releasing the reflective layer 814. In some embodiments, a plurality of suitable etchants is used to etch away the first sacrificial structure 850 and/or the second sacrificial structure 860 (if present). In some embodiments, the first and second sacrificial structures 850, 860 are etched contemporaneously, while in others, they are etched separately. Those skilled in the art will understand that the particular etchant or etchants used in a particular process will depend on the identities of the sacrificial materials in the MEMS device, the identities of the structural materials, the structure of the MEMS device, and the like.

In some embodiments, the release etch is performed using a vapor phase etchant that selectively etches both the first sacrificial structure 850 and the second sacrificial structure 860 (if present). The vapor phase etchant accesses the first sacrificial structure 850 and the second sacrificial structure 860 through one or more etch holes (not illustrated) formed in the deformable layer 834 and/or reflective layer 814, through gaps between strips of the deformable layer 834 and/or reflective layer 814, and/or from the sides of the device. In some preferred embodiments, the vapor phase etchant comprises one or more fluorine-based etchants, and in particular, vapor phase xenon difluoride ($XeF_2$). At ambient temperature, xenon difluoride is a solid with a vapor pressure of about 3.8 Torr (0.5 kPa at 25° C.). Vapor from xenon difluoride selectively etches certain sacrificial materials, that is, without requiring a plasma. In some embodiments, the MEMS device is released by removing a sacrificial material in an etch chamber that is connected to a load lock. In some of these embodiments, no water vapor or other contaminants are present during the etch.

Those skilled in the art will understand that the materials comprising the sacrificial structures are selected in conjunction with structural and/or non-sacrificial materials of the device such that the sacrificial material(s) are selectively etched over the structural materials. In embodiments using $XeF_2$ as an etchant in the release etch, the sacrificial material may comprise at least one of silicon, germanium, titanium, zirconium, hafnium, vanadium, tantalum, niobium, molybdenum, tungsten, and mixtures, alloys, and combinations thereof. In some embodiments, the sacrificial material comprises at least one of molybdenum, tungsten, silicon, germanium, and silicon/molybdenum. In some embodiments, the sacrificial structure comprises an organic compound, for example, a polymer such as a photoresist. In some embodiments, a sacrificial structure comprises a single layer. In other embodiments, a sacrificial structure comprises a plurality of layers. Suitable structural materials are known in the art. Where the etchant comprises $XeF_2$, suitable structural materials resist etching by $XeF_2$, and include, for example, silica, alumina, oxides, nitrides, polymers, aluminum, nickel, chromium, and the like.

Figure 9A:
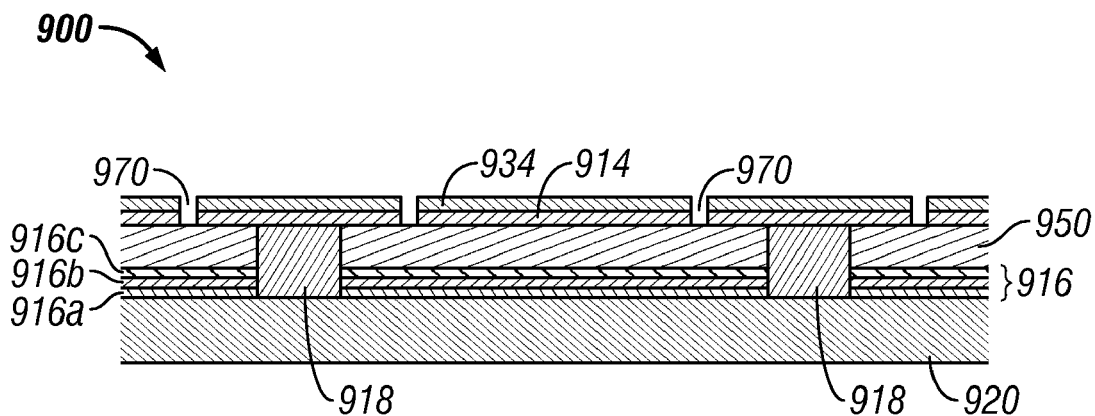
FIG. 9A illustrates a cross section of an embodiment of an unreleased interferometric modulator.

FIG. 9A illustrates a side cross-sectional view of an embodiment of an unreleased interferometric modulator 900 similar to the embodiment illustrated in FIG. 8A, which after release etching, provides a MEMS device similar to the embodiment illustrated in FIG. 7A. Those skilled in the art will understand that certain features described with reference to the illustrated embodiment are also useful in other embodiments of interferometric modulators, including embodiments illustrated in FIGS. 7B-7E, as well as in other types of MEMS devices.

In the illustrated embodiment, the device 900 comprises a substrate 920 on which is formed an optical stack 916 comprising a conductive layer 916a, a partially reflective layer 916b, and a dielectric layer 916c. The optical stack 916 represents a lower stationary electrode of the MEMS device. A support structure illustrated as comprising a plurality of support posts 918 extends from the optical stack 916 and supports a movable reflective layer 914 and deformable layer 934. In the illustrated embodiment, the movable reflective layer 914 comprises a layer of a first material, for example, aluminum and/or aluminum alloy, and the deformable layer 934, comprises a layer of a second material, for example, nickel and/or nickel alloy. As discussed above, some embodiments comprise an integrated movable reflector and deformable layer. A plurality of etchant access openings or etch holes 970 is formed in the movable reflective layer 914/deformable layer 934. Those skilled in the art will understand that other arrangements of etch holes are used in other embodiments.

Figure 9B:
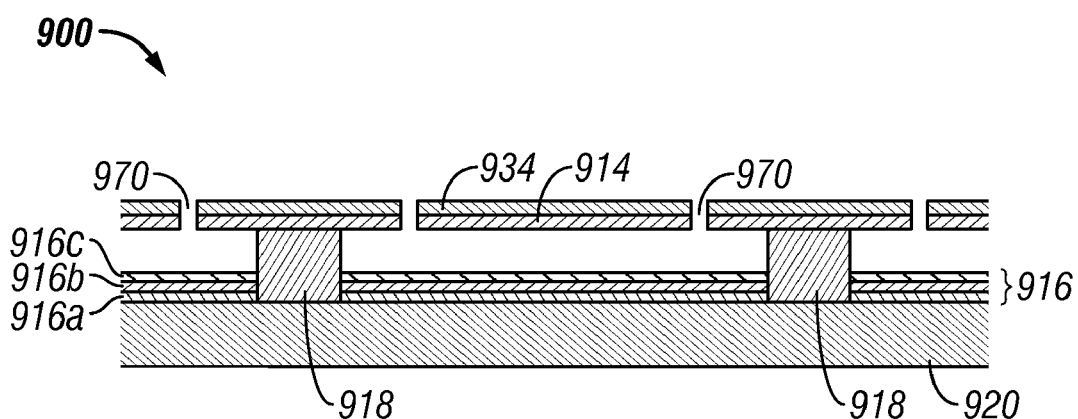
FIG. 9B illustrates a cross section of an embodiment of the interferometric modulator of FIG. 9A after release etching.

Between the optical stack 916 and the movable reflective layer 914 is formed a sacrificial structure 950. Those skilled in the art will understand that other embodiments, for example, some embodiments corresponding to FIGS. 8C-8E, can comprise multiple sacrificial structures. As discussed above, contacting the device 900 with a suitable etchant etches away the sacrificial structure 950, thereby providing a released MEMS device 900 as illustrated in FIG. 9B.

Unexpectedly, treating embodiments of a released MEMS device, for example, the device 900, with water vapor has been found to improve one or more properties of the device including reducing stiction; reducing the hydrophilicity of or rendering hydrophobic one or more of the surfaces of the device; and/or reducing variation in one or more electrical properties. The treatment is discussed in greater detail below.

The performance of MEMS devices in general and interferometric modulators in particular, may be adversely affected by a condition known in the art as "stiction." With reference to the device illustrated in FIG. 1, stiction can cause the actuated movable reflective layer 14b to remain in contact with the optical stack 16b in the presence of a restoring force that would otherwise be expected to return the movable reflective layer 14b to the relaxed position. Stiction occurs when the sum of adhesion forces maintaining the device in the actuated position is greater than the force for restoring the device to the relaxed position. The restoring force includes mechanical tension forces of the actuated movable reflective layer 14b.

Adhesion forces are believed to originate from several sources, including, for example, capillary forces, van der Waals interactions, chemical bonding, and trapped surface charges. In all of these mechanisms, adhesion forces increase with increased contact area between relatively movable components, for example, the movable reflective layer 14b and optical stack 16b, and decreases with increasing separation between the relatively movable components.

In a display device comprising an array of interferometric modulators, stiction in individual interferometric modulators prevents the array from properly displaying an image. In some cases, stiction delays the relaxation of the movable reflective layer 14b, resulting in slow response times. In other cases, stiction prevents the movable reflective layer 14b from returning to the relaxed configuration at all. Cases in which the stiction prevents the MEMS device from relaxing at all are considered a complete failure of the device. Accordingly, significant effort has been made in reducing and/or eliminating stiction. Treatment of embodiments of released MEMS devices with water vapor as described below has been found to reduce and even eliminate stiction.

After etching, one or more of the exposed surfaces of the resulting released MEMS device may be hydrophilic or highly hydrophilic. Such hydrophilicity may have a negative impact on device performance. For example, in some cases, on contacting the movable reflective layer 914 of the released MEMS device with liquid water, the degree of hydrophilicity is such that the water quickly wets the surface of the movable reflective layer 914 and enters the cavity through the etch holes 970. Exposure to water vapor can lead to condensation of liquid water within the device 900. Exposure of the device 900 to such moisture can lead to failure of the MEMS device, for example, by preventing the actuation and/or relaxation of the device as described above. Accordingly, MEMS devices are typically encapsulated to avoid contact with moisture, for example, in a semi-hermetically or hermetically sealed package. One or more desiccants may be provided in the packaging to scavenge any moisture therein, either residual or exogenous. Such packaging and inclusion of desiccant, however, increases costs, requires additional design/engineering resources, and/or introduces additional variables into the MEMS environment. For example, in some cases, a desiccant in the packaging can shed residues, which affect the offset voltage of a MEMS device, cause stiction, and/or inhibit the motion of the movable reflective layer.

Some embodiments of treatments of MEMS devices with water vapor have been found to reduce the hydrophilicity of at least some of the treated surfaces, and to even make some of the treated surfaces hydrophobic, a process referred to herein as "passivation." Types of surfaces passivated by the treatment include metal surfaces and metal oxide surfaces. Some embodiments of MEMS devices comprising passivated surfaces exhibit reduced or even no sensitivity to liquid or vapor phase water.

Accordingly, some embodiments permit packaging with some combination of reduced, different, and/or no desiccant, thereby reducing complexity, potential failure modes, and/or cost. In some embodiments, the packaging of the treated MEMS device is not semi-hermetic or hermetic, that is, permitting significant contact with the ambient environment.

Embodiments of electromechanical MEMS devices such as interferometric modulators are also susceptible to variations or changes in the electrical characteristics of the device that affect the operation of the device, for example, potentials or voltages. Examples are illustrated in FIG. 3 and described above, include the actuation voltage $V_a$ ($V_{bias}$ in FIG. 3), release voltage $V_r$ ($-V_{bias}$ in FIG. 3), offset voltage, and window. "Offset voltage" or "offset" is the deviation or offset of the voltage of the device in the relaxed position from 0 V. Offset changes the values of the actuation voltage $V_a$ and the release voltage $V_r$ by the value of the offset. "Window" is the width of the hysteresis window illustrated in FIG. 3 and described above. While such changes to individual devices are undesirable, the effect of these changes on an array of devices is particularly problematic if the changes are not uniform over all of the interferometric modulators in the array. Non-uniform changes in one or more of these parameters can render an array of interferometric modulators non-functional for practical purposes because the voltage signals described above and illustrated in FIGS. 5A and 5B will fail to operate one or more of the interferometric modulators that make up the pixels or subpixels of the array. In particular, non-uniform changes in the offset voltage can be particularly troublesome because offset voltage affects both the actuation voltage $V_a$ and the release voltage $V_r$.

Without being bound by theory, it is believed that these changes in the offset voltage arise from surface charges that build up in traps in a dielectric layer, particularly, at or near the surface of the dielectric layer. Some of these traps are intrinsic, for example, formed during the deposition of the dielectric layer. The concentration of intrinsic traps in a dielectric layer depends on factors including the deposition method and the particular dielectric material deposited. Other traps are extrinsic, for example, formed by damage to the dielectric layer or by manufacturing residues.

Figure 13:
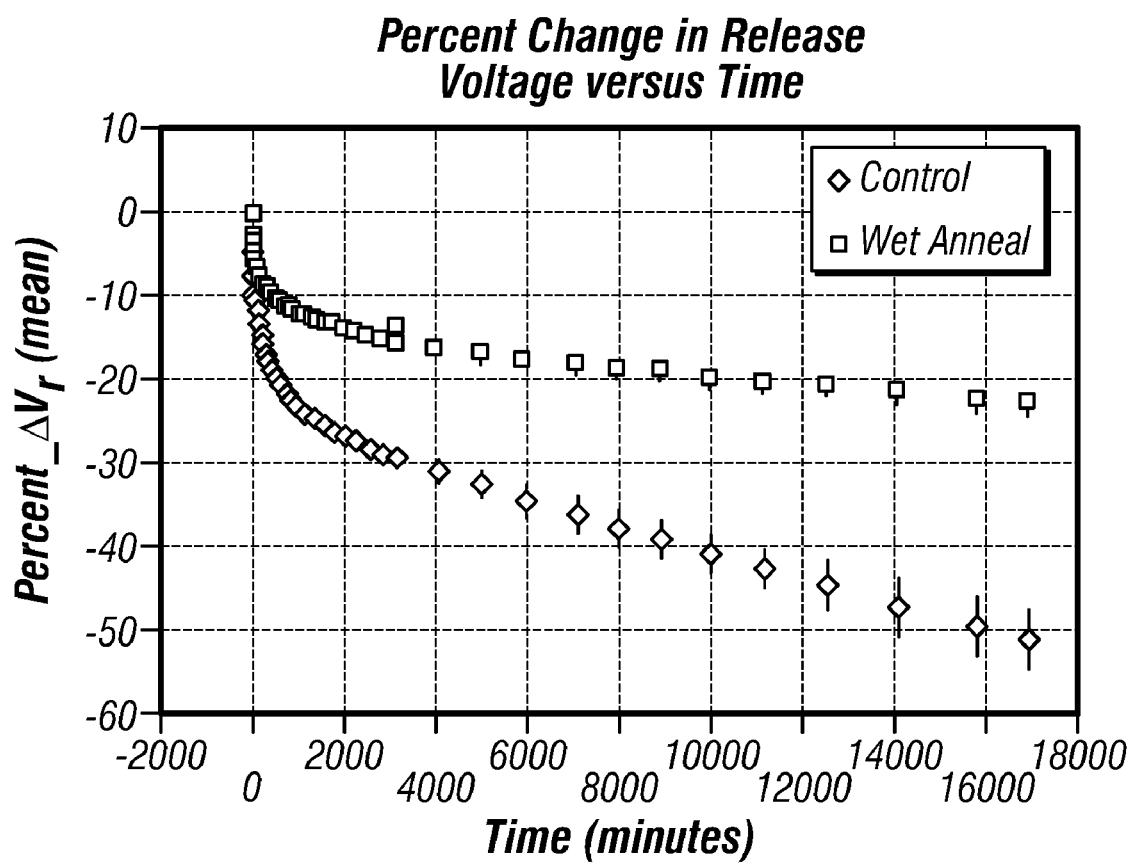
FIG. 13 is a graph showing percent change in release voltage ($V_r$) versus time data for wet annealed MEMS devices and control devices.
Figure 14:
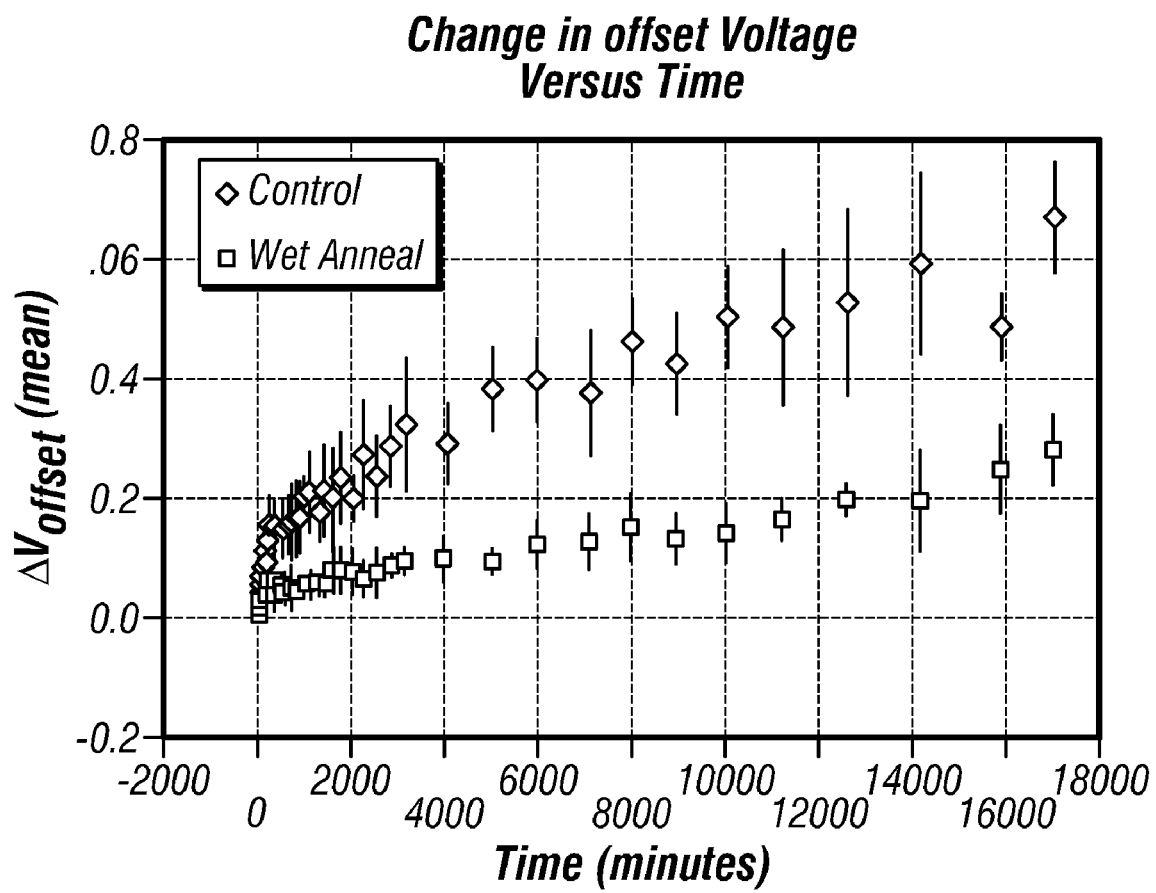
FIG. 14 is a graph showing change in offset voltage ($V_{OFFSET}$) versus time data for wet annealed MEMS devices and control devices.

Embodiments of MEMS arrays treated with water vapor after a sacrificial removal process exhibit reduced inter-device variation in at least one electrical property—for example, actuation voltage, release voltage, offset voltage, or window—compared to an untreated array by at least about 10%, at least about 20%, by at least 30%, by at least 40%, or by at least 50%. FIG. 13 shows percent change in mean release voltage (Percent_$\Delta V_r$) versus time for both control and wet annealed interferometric modulators. The change is measured relative to the initial release voltage ($V_r$) (at time=0). FIG. 13 shows significant reduced time variation of release voltage ($V_r$) between wet annealed parts and control parts. Release voltage ($V_r$) is believed to be related to stiction forces such that the greater the percent change in release voltage ($V_r$), the greater the probability of stiction. FIG. 14 shows change in mean offset voltage ($\Delta V_{offset}$) versus time for both control and wet annealed interferometric modulators. FIG. 14 shows reduced time variation of offset voltage ($V_{offset}$) between wet annealed parts and control. In both FIGS. 13 and 14, as indicated by the bars about the data points for the control (diamond) and wet annealed parts (square), array to array variation is also reduced in wet annealed MEMS arrays. As discussed above reducing variations in these properties can improve the yield of usable arrays.

Figure 10:
FIG. 10 is a flowchart illustrating a method for treating a released MEMS device with water vapor.

FIG. 10 is a flowchart 1000 illustrating a method for treating a released MEMS device, for example, an interferometric modulator, with water vapor. As discussed above, in some embodiments, the MEMS device is an element in an array of MEMS devices.

In step 1010, the released MEMS device, having cavity surfaces exposed by etching or otherwise removing a sacrificial material, is treated with water vapor, for example, in a suitable reactor or reaction chamber. Step 1010 is also referred to herein as a "wet anneal." In some embodiments, the contact time with the water vapor will depend on factors including the relative humidity (concentration of water vapor), temperature, combinations thereof, and the like. In some embodiments, the relative humidity is at least about 10%, at least about 30%, at least about 50%, at least about 70%, or at least about 90%. For example, in some embodiments, the relative humidity is from about 50% to about 90%, from about 60% to about 90%. In some embodiments, contact times are at least about 0.1 hr, at least about 0.5 hr, at least about 1 hr, at least about 2 hr, at least about 5 hr, at least about 10 hr, or at least about 20 hr. In some embodiments, the contact time is from about 0.1 hr to about 20 hr, from about 0.5 hr to about 10 hr, or from about 1 hr to about 5 hr. Optionally, the MEMS device is heated during the treatment, for example, to a temperature in the range of from about 25° C. to about 175° C., from about 50° C. to about 120° C., from about 60° C. to about 150° C., from about 80° C. to about 120° C. In some embodiments, contact between the released MEMS device and liquid water is avoided for the reasons discussed above.

In some embodiments, the temperature and relative humidity are both constant during the treatment in step 1010, while in other embodiments, at least one of the temperature and relative humidity is varied. For example, in some embodiments, at least one of the treatment parameters is varied in a gradient. In some embodiments, at least one of the treatment parameters is pulsed. For example, in some embodiments, the relative humidity is pulsed; that is, pulses of a reaction gas comprising water vapor are contacted with the MEMS device. In some embodiments, the pulses of water vapor are alternated with contact with an inert gas known in the art, for example, $N_2$, Ar, He, combinations, and the like.

In some embodiments, the MEMS device is optionally contacted with at least one other process or reactive gas in step 1010, for example, to modify the passivation process and/or for another function. Contact of the MEMS device with each of the one or more optional process gases is independently continuous, non-continuous, or a combination thereof. For example, in some embodiments, at least one optional process gas is pulsed contemporaneously with the water vapor, while in other embodiments, pulses of at least one optional process gas are alternated with pulses of water vapor. Exemplary gases for contemporaneous or alternate pulsing with water vapor include, but are not limited to, $N_2$, $N_2O$, $H_2$, $O_2$, $O_3$, etc.

In optional step 1020, one or more other processes are performed on the MEMS device, for example, by conducting at least one of cleaning, vapor phase deposition, vapor phase treatment, thermal treatment, and the like. In some embodiments, optional processing is performed before step 1010. In some embodiments, optional processing is performed after the completion of step 1010. In other embodiments, optional processing occurs substantially contemporaneously with at least a portion of step 1010, for example, between pulses of water vapor. Other embodiments comprise any combination of optional processing before, during, or after step 1010.

For example, in some embodiments, the MEMS device is heat treated or baked before step 1010 is performed. Embodiments of heat treatment comprise heating the MEMS device to a selected temperature for a selected time: for example, to at least about 50° C., to at least 60° C., to at least 70° C., to at least about 80° C., to at least 90° C., to at least 100° C., or even higher, for at least about 5 min, at least about 10 min, at least about 20 min, at least about 30 min, at least about 40 min, at least about 50 min, at least about 60 min, at least about 90 min, at least about 120 min, or even longer. The heat treatment is carried out at a temperature lower than the temperature of the wet anneal in step 1010, about the same as the temperature of the wet anneal, and/or higher than the temperature of the wet anneal. In some embodiments, the temperature is substantially constant during the heat treatment, while in others, the temperature is not substantially constant, for example, comprises one or more gradients, optionally in combination with one or more constant temperature periods. Those skilled in the art will understand that the MEMS device will experience a temperature gradient while heating and/or cooling to a selected temperature.

Optionally, the MEMS device is contacted with at least one reagent and/or process gas during at least a portion of the heat treatment, for example, to clean the MEMS, to remove impurities, to modify a surface, and the like. In some embodiments, at least a portion of the heat treatment is performed in a substantially inert environment known in the art, for example, nitrogen, argon, helium, combinations, and the like.

An example of an optional processing step 1020 performed after step 1010 is a deposition of a layer on a surface of the MEMS device by any method known in the art. Some embodiments of step 1020 comprise deposition of a layer within a cavity of a MEMS device, for example, by atomic layer deposition (ALD). A dielectric layer can be deposited using ALD. In other embodiments, a self-assembled monolayer (SAM) is deposited onto the MEMS device after step 1010.

In some embodiments, steps 1010 and 1020 are performed in the same reaction chamber, for example, performing a heat treatment, followed by a wet anneal, followed by an ALD deposition, all in an ALD reactor. Other embodiments use a plurality of reaction chambers.

Without being bound by any theory, it is believed that the water vapor treatment passivates certain surfaces of some embodiments of MEMS devices, thereby making them hydrophobic. For example, on applying a drop of water to the deformable layer 934 of a freshly released MEMS device of the type illustrated in FIG. 9A, the water rapidly wets the deformable layer 934, and enters the cavity of the MEMS device through etch holes 970. In some of these embodiments, the contact angle of the water droplet is about 0°, indicating that the surface is hydrophilic. In some embodiments, after treatment with water vapor, the contact angle of a water droplet on the surface of the deformable layer 934 increases to at least 50°, at least 60°, at least 70°, at least 80°, or at least 90°. A droplet of water applied to the deformable layer 934 remains on the surface and does not enter the etch holes 970. Less polar solvents, for example, acetone or alcohols, do enter the etch holes in some embodiments. It is believed that water vapor enters the cavity of the device 900, thereby also modifying the properties of at least some of the surfaces of the cavity. For example, it is believed that in the illustrated embodiment, the water vapor treatment also renders at least some of the formerly hydrophilic surfaces of the movable reflector 914 hydrophobic.

In some embodiments, the wet anneal treatment affects the mechanical properties of at least one component of the MEMS device. In some embodiments, the stiffness of the deformable layer 934 may change, for example, increasing the launching, which increases the length of the optical path, thereby shifting the color of an interferometric modulator to a longer wavelength. Accordingly, in some embodiments, the height of the gap or cavity 19 (FIG. 1) is adjusted to compensate for this change, for example, by adjusting the thickness of a sacrificial structure 850 (FIG. 8A-8E).

Without being bound by any theory, it is believed that a wet anneal process may, in some instances, lead to absorption of water by structures within the MEMS device that are formed of water-absorbing material. For example, a MEMS device may comprise pillars or posts formed of non-metal, inorganic material (e.g., an oxide like $SiO_2$), and at some exposure parameters, these structures may absorb water. A high temperature bake after wet annealing, e.g., annealing from about 80° C. to about 150° C., and more particularly at 100° C. to 130° C., may help to remove water that may have absorbed onto various surfaces and structures of a MEMS device.

Experiments conducted with wet anneals at 85° C. and 85% humidity resulted in the high hydrophobicity noted above (see Example 1, below). Other experiments with more gentle wet anneal (e.g., 65° C. at 65% relative humidity, see Examples 6 and 7) showed lower levels of hydrophobicity as measured by "advancing" contact angle for water droplets. Nevertheless, hydrophobicity did increase, as evidenced by high "receding" contact angle, such that water is easily removed from the released and wet annealed MEMS. Advancing contact angle refers to the angle at which a liquid meets a surface upon the addition of water, while receding contact angle refers to the angle at which the liquid meets the surface upon the controlled removal of the water. The lightly wet annealed MEMS of Examples 6 and 7 showed improved electrical and mechanical characteristics for interferometric modulator (IMOD) functionality. Furthermore, receding contact angle in droplet tests demonstrate good quality electrode surfaces for both IMOD and MEMS pump functionality due to the ease with which water can be removed from such water-passivated MEMS. A MEMS pump refers to MEMS devices used to move or pump a liquid. Improved receding contact angle can be helpful in removing water from between surfaces, such as the collapsing surfaces of a MEMS device.

Without being bound by any theory, it is believed that the water vapor treatment may help reduce stiction by changing the surface chemistry of various surfaces in a MEMS device, such as layer 914 (FIG. 9B), particularly surfaces defining the cavity and exposed by removal of the sacrificial layer. For example, a wet anneal may help to hydrolyze exposed metal surfaces, such as aluminum, within the MEMS device. After release of the MEMS device, any residual surface fluorides may also be hydrolyzed. The resulting surfaces of the facing electrodes have been found in experiments to exhibit less stiction after the wet anneal, as compared to devices formed without a wet anneal. Hence, it is believed that the wet anneal treatment changes the surface chemistry of the cavity surface formed by the removal of the sacrificial material or structure such that at least one surface property of the surface is modified to be less susceptible to stiction. Moreover, reduced heat and humidity levels (e.g., less than 100° C. and less than 85% relative humidity) result in less water retention in the wet annealed device, and also ensure mere surface chemistry modification for the desired effect on operation.

In some embodiments, the wet anneal process includes heating the MEMS device to between about 50° C. and about 100° C. In some embodiments, the wet anneal process includes heating the MEMS devices up to 100° C. or lower, for example, at about 60° C. to 80° C. In some embodiments, the wet anneal process also includes exposing the MEMS device to relative humidity of about 55% to about 75%, more particularly from about 60% to about 70% relative humidity. In some embodiments, the electromechanical device is exposed to an environment of below 85% relative humidity, preferably about 65% relative humidity. In some embodiments, the MEMS device is heated first to a set temperature, and exposed to a humid environment only after the MEMS device has reached the set temperature. In some embodiments, the MEMS device is treated with water vapor for less than 1 hr. and in some embodiments less than 2 hrs. In other embodiments, the MEMS device is treated for longer, such as 2 to 6 hrs. In some embodiments, the wet anneal is conducted under ambient or atmospheric pressure conditions. The pressure in the chamber may vary slightly from ambient pressure due to the process conditions, but the water treatment chamber need not be configured to be pressurized or to be pumped to low pressure. In some embodiments, the pressure is about 1 atmosphere, and the experiments described below were conducted under ambient or atmospheric pressure.

Figure 11:
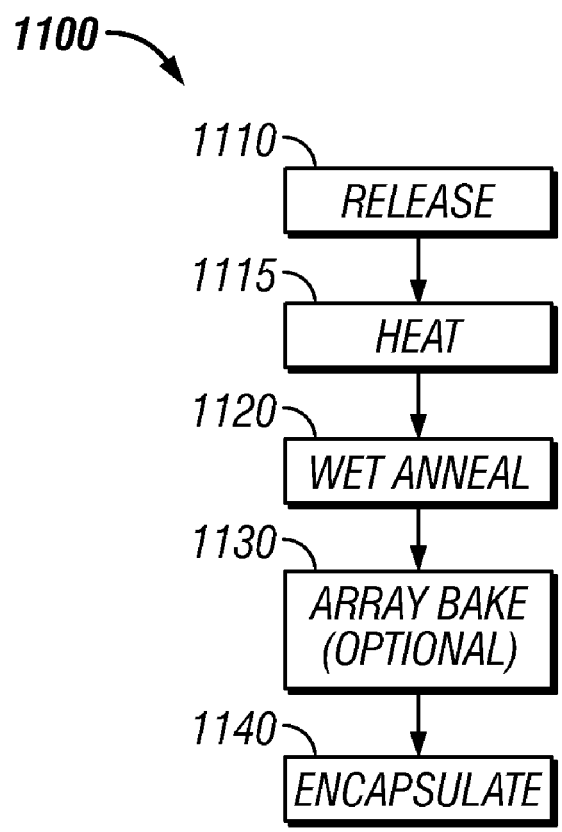
FIG. 11 is a flowchart illustrating a method for manufacturing a MEMS device with improved stiction.

FIG. 11 is a flowchart 1100 illustrating a method for processing a MEMS device, for example, an interferometric modulator. As discussed above, in some embodiments, the MEMS device is an element in an array of MEMS devices.

As illustrated in step 1110, the MEMS device is released by removing a sacrificial material from the MEMS device, typically by etching the sacrificial material between parts to exposure surfaces that define the collapsible gap. The etchant used may comprise a fluorine-based etchant, such as $XeF_2$, HF, or $SF_6$, among others. Use of an etch chamber provided with a load lock has been found to reduce the formation of undesirable particles. After loading into a wet anneal chamber, the substrate is first heated 1115 to at least 40° C., in some embodiments to at least 50° C., before exposing 1120 the substrate to water vapor at 50° C. to 100° C., preferably 60° C. to 70° C. Optionally, the wet anneal may be followed by an array bake step 1130, where, as discussed above, the MEMS device is treated at high temperature. Step 1130 may be performed at a temperature of greater than 100° C., for example, at about 120° C., although other temperatures may be used as discussed elsewhere herein. After step 1130, the MEMS device may be packaged or encapsulated in step 1140. In some embodiments, the MEMS device is encapsulated without desiccant. It is understood that, as necessary or desirable, other steps or processes may be performed in between steps 1110, 1115, 1120, 1130, and 1140.

Figure 12:
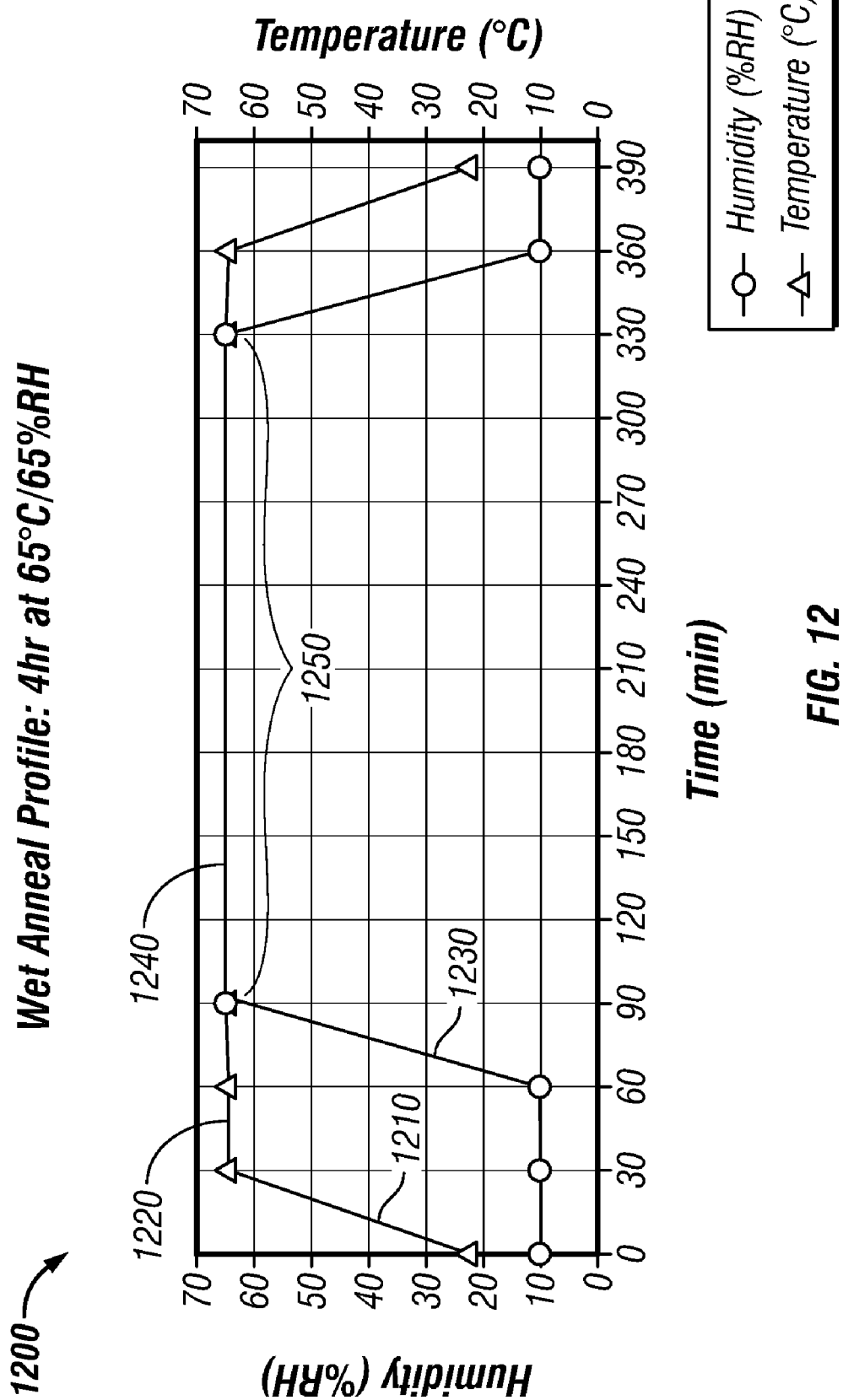
FIG. 12 is an embodiment of a wet anneal temperature and relative humidity versus time profile.

The heating 1115 and wet anneal 1120 (FIG. 11) may follow a profile 1200 as illustrated in FIG. 12. In the illustrated embodiment, the MEMS device is first ramped (illustrated by line 1210) to an anneal temperature 1220, and kept at a fixed temperature for a period of time. In some embodiments, the anneal temperature is kept below 85° C. (65° C. in the example). Advantageously, the humidity is kept low during this period, for example 45% relative humidity or less (10% in the example). Then, the relative humidity of the anneal chamber is ramped (illustrated by line 1230) to an anneal humidity 1240, and kept at a fixed relative humidity for a period of time. Because heating is conducted prior to the exposure to water, there is less risk of condensation and less absorption of water by the device. In some embodiments the MEMS device is exposed to water vapor after the MEMS device has been heated to and stabilized at a steady state temperature (anneal temperature 1220) and while maintaining the MEMS device at the steady state temperature. In some embodiments, the anneal humidity 1240 is less than 85% relative humidity (65% in the example). In some embodiments, the anneal time 1250 is less than 5 hrs (4 hrs in the example of FIG. 12). Other anneal temperatures, humidities, and times are possible as discussed elsewhere herein.

Example 1

Arrays of unreleased interferometric modulators similar to the embodiment illustrated in FIG. 9A was fabricated on a glass substrate 920, on which was deposited the following layers: an indium tin oxide conductive layer 916a, 80 Å of a molybdenum/chromium partial reflective layer 916b, 400-500 Å of a silicon dioxide dielectric layer, 2000 Å of a molybdenum sacrificial structure 950, 300 Å of an aluminum movable reflective layer 914, and 1000 Å of a nickel deformable layer 934. The sacrificial structure 950 was removed in a release etch using vapor phase $XeF_2$ to provide a structure similar to that illustrated in FIG. 9B. The deformable layer 934 of resulting released interferometric modulator array was highly hydrophilic. A drop of water applied to the deformable layer 934 quickly wetted the surface (0° contact angle) and entered the cavity of the MEMS device through the etch holes 970.

Released arrays were then treated with water vapor at 85% relative humidity for from 4-68 hr at 85° C. The deformable layer 934 of the treated interferometric modulators was hydrophobic with a contact angle of about 80°. No stiction was observed on operation of the interferometric modulators of the arrays.

Example 2

Interferometric modulator arrays were manufactured and release etched as described in EXAMPLE 1. An array was treated at 85% relative humidity at 60° C. for 8 hr. The resulting device exhibited hydrophobicity and stiction characteristics similar to the arrays of EXAMPLE 1.

Example 3

An array of released interferometric modulators similar to those used in EXAMPLE 1 was placed over a beaker of water at ambient temperature (~20° C.) for 12 hr. Hydrophobicity and stiction characteristics were similar to those observed in EXAMPLE 1.

Example 4

Arrays of interferometric modulators were manufactured and treated (wet annealed) as described in EXAMPLE 1. A breath test was conducted, in which a person breathes on the deformable layer 934 of the array, thereby delivering moist air thereto. On the treated array, the moisture formed beads on the deformable layer 934. In contrast, on an untreated array, no beads of moisture were visible on the deformable layer 934. Apparently, the moisture from the breath had spread evenly over the deformable layer 934. A treated array was dipped in deionized water, after which it was operable with no stiction observed. Measured contact angles of water on the deformable layer 934 of treated arrays were about 90°-100°, as measured by a goniometer. For untreated arrays, contact angles were about 30°-40°.

A treated array was disassembled by peeling off the deformable layer/reflective layer 934/914. Each of the nickel deformable layer 934, the aluminum reflective layer 914 and the aluminum oxide dielectric layer 916c was hydrophobic by contact angle measurement. In contrast, each of these surfaces was hydrophilic in untreated arrays.

Example 5

Actuation voltages ($V_a$), release voltages ($V_r$), offset voltages (offset), and hysteresis windows (window) were determined for interferometric modulators of arrays manufactured and treated (wet annealed) as described in EXAMPLE 1, as well as for similar, untreated arrays. As shown in TABLE 1 the standard deviations of these parameters for the treated arrays were lower than for the untreated arrays.

TABLE 1

|  | Untreated | | Treated | |
| --- | --- | --- | --- | --- |
|  | Mean | s | Mean | s |
| $V_a$ | 6.75 | 0.2 | 6.5 | 0.168 |
| $V_r$ | 4.5 | 0.16 | 4.75 | 0.083 |
| Offset | 0.19 | 0.0222 | 0.15 | 0.01 |
| Window | 2 | 0.178 | 2.25 | 0.087 |

Example 6

Arrays of unreleased interferometric modulators similar to the embodiment illustrated in FIG. 9A were fabricated on a glass substrate 920, on which was deposited the following layers: an indium tin oxide conductive layer 916a, 80 Å of a molybdenum/chromium partial reflective layer 916b, 400-500 Å of a silicon dioxide dielectric layer, 2000 Å of a molybdenum sacrificial structure 950, 300 Å of an aluminum movable reflective layer 914, and 1000 Å of a nickel deformable layer 934. The sacrificial structure 950 was removed in a release etch using vapor phase $XeF_2$ to provide a structure similar to that illustrated in FIG. 9B. The sacrificial structure 950 was removed in an etch chamber that is connected to a load lock. The released arrays were then treated with water vapor at 65% relative humidity for 4 hr at 65° C. No stiction was observed on operation of the interferometric modulators of the arrays after exposure to both liquid water and vapor water. Control interferometric modulators similar to these, but without treatment with water vapor, did exhibit stiction.

Example 7

Arrays of interferometric modulators were manufactured and treated (wet annealed) as described in EXAMPLE 6. A first group of wet annealed interferometric modulators were packaged with no desiccant, and a second group of interferometric modulators were left untreated (not wet annealed). Modulators were actuated and released at twice the actuation voltage with a 15 Hz charge-balanced 97% MDC waveform at 25° C. The time variation of the release voltage ($V_r$), and offset voltage ($V_{offset}$) is shown in FIGS. 13 and 14. As shown in FIGS. 13 and 14, after ~17,000 minutes (~280 hours), the first (wet annealed) group exhibited less percent change in mean release voltage ($V_r$) and lower mean offset voltage ($V_{offset}$) as compared to the control group (not wet annealed).

Those skilled in the art will understand that changes in the apparatus and manufacturing process described above are possible, for example, adding and/or removing components and/or steps, and/or changing their orders. Moreover, the methods, structures, and systems described herein are useful for fabricating other electronic devices, including other types of MEMS devices, for example, other types of optical modulators.

Moreover, while the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method for treating an electromechanical device, the method comprising: providing an electromechanical device comprising a surface that defines at least a portion of a cavity, the surface being exposed by removing a sacrificial material, wherein the surface comprises one of a metal and a dielectric; and wherein treating the electromechanical device comprises treating the electromechanical device with water vapor at or below ambient pressure such that surface chemistry of the surface is modified to be less susceptible to stiction, relative to the device without water vapor treatment.

2. The method of claim 1, wherein treating the electromechanical device comprises treating at least one of a microelectromechanical systems (MEMS) and a nanoelectromechanical systems (NEMS).

3. The method of claim 1, wherein treating the electromechanical device comprises treating an array comprising a plurality of the electromechanical devices.

4. The method of claim 3, wherein treating the electromechanical device comprises reducing variability, relative to the device without water vapor treatment, of one of:
an actuation voltage among the plurality of the electromechanical devices;
a release voltage among the plurality of the electromechanical devices; and
a hysteresis window among the plurality of the electromechanical devices.

5. The method of claim 1, wherein treating the electromechanical device comprises stabilizing an offset voltage in the electromechanical device.

6. The method of claim 1, wherein treating the electromechanical device with water vapor comprises exposing the electromechanical device to an environment of from about 50% to about 90% relative humidity.

7. The method of claim 1, wherein treating the electromechanical device with water vapor comprises exposing the electromechanical device to an environment of below 85% relative humidity.

8. The method of claim 1, wherein treating the electromechanical device with water vapor comprises treating the electromechanical device with water vapor at a temperature between about 50° C. to about 120° C.

9. The method of claim 8, wherein treating the electromechanical device with water vapor comprises treating the electromechanical device with water vapor at a temperature below 100° C.

10. The method of claim 1, wherein treating the electromechanical device with water vapor comprises exposing the electromechanical device to an environment of 55% to 75% relative humidity at 60° C. to 80° C. for 2 to 6 hours.

11. The method of claim 1, wherein treating the electromechanical device with water vapor comprises treating the electromechanical device with pulses of water vapor.

12. The method of claim 1, wherein the sacrificial material is removed by dry etching using an etchant comprising a fluorine-based etchant.

13. The method of claim 12, wherein the etchant is $XeF_2$.

14. The method of claim 1, wherein the sacrificial material is removed in a chamber that is connected to a load lock.

15. The method of claim 1, further comprising heating the electromechanical device after the sacrificial material is removed and before treating the electromechanical device with water vapor.

16. The method of claim 1, further comprising heat treating the electromechanical device after treating the electromechanical device with water vapor at a temperature of greater than 100° C.

17. The method of claim 1, further comprising depositing a layer on the surface of the electromechanical device after treating the electromechanical device with water vapor.

18. The method of claim 17, wherein the deposited layer is selected from the group consisting a dielectric layer or a self-assembling monolayer.

19. An apparatus comprising a water-vapor passivated MEMS device, wherein the water-vapor passivated MEMS device comprises:
   a first layer comprising a partial reflector;
   a reflective layer movable relative to the first layer; and
   a cavity, an interior of which is defined by the first layer and the reflective layer, wherein at least a portion of a surface of the cavity is water-vapor passivated after a sacrificial removal process.

20. The apparatus of claim 19, further comprising an upper surface exterior of the cavity, wherein the upper surface exterior of the cavity comprises a water-vapor passivated surface.

21. The apparatus of claim 19, wherein the at least a portion of the surface of the cavity comprises a metal or dielectric surface.

22. The apparatus of claim 19, further comprising:
   a display;
   a processor that is configured to communicate with said display, said processor being configured to process image data; and
   a memory device that is configured to communicate with said processor.

23. The apparatus of claim 22, further comprising a driver circuit configured to send at least one signal to the display.

24. The apparatus of claim 23, further comprising a controller configured to send at least a portion of the image data to the driver circuit.

25. The apparatus of claim 19, further comprising an image source module configured to send said image data to said processor.

26. A method for reducing stiction in a microelectromechanical systems (MEMS) device, the method comprising:
   removing a sacrificial material from a MEMS device;
   heating the MEMS device after removing the sacrificial material, wherein heating the MEMS device comprises exposing the MEMS device to a maximum temperature lower than approximately 100° C.; and exposing and treating the MEMS device with water vapor after heating.

27. The method of claim 26, wherein heating the MEMS device comprises heating the MEMS device to between 50° C. and 100° C.

28. The method of claim 26, wherein treating the MEMS device with water vapor comprises exposing a surface to water vapor at a relative humidity of less than 85% relative humidity.

29. The method of claim 26, wherein exposing and treating a MEMS device with water vapor comprises exposing the MEMS device to water vapor at or below ambient pressure.

30. The method of claim 26, wherein exposing and treating the MEMS device with water vapor comprises exposing the MEMS device to water vapor in the same chamber as heating the MEMS device.

31. The method of claim 26, wherein exposing and treating a MEMS device with water vapor comprises exposing the MEMS device to water vapor after the MEMS device has stabilized at a steady state temperature and while maintaining the MEMS device at the steady state temperature.

* * * * *

UNITED STATES PATENT AND TRADEMARK OFFICE
CERTIFICATE OF CORRECTION

PATENT NO. : 7,738,158 B2 Page 1 of 1
APPLICATION NO. : 12/163660
DATED : June 15, 2010
INVENTOR(S) : Natarajan et al.

It is certified that error appears in the above-identified patent and that said Letters Patent is hereby corrected as shown below:

In the Drawings:
In the figures, please replace "0.06" on the y axis with --0.6-- as indicated in the replacement figure below:

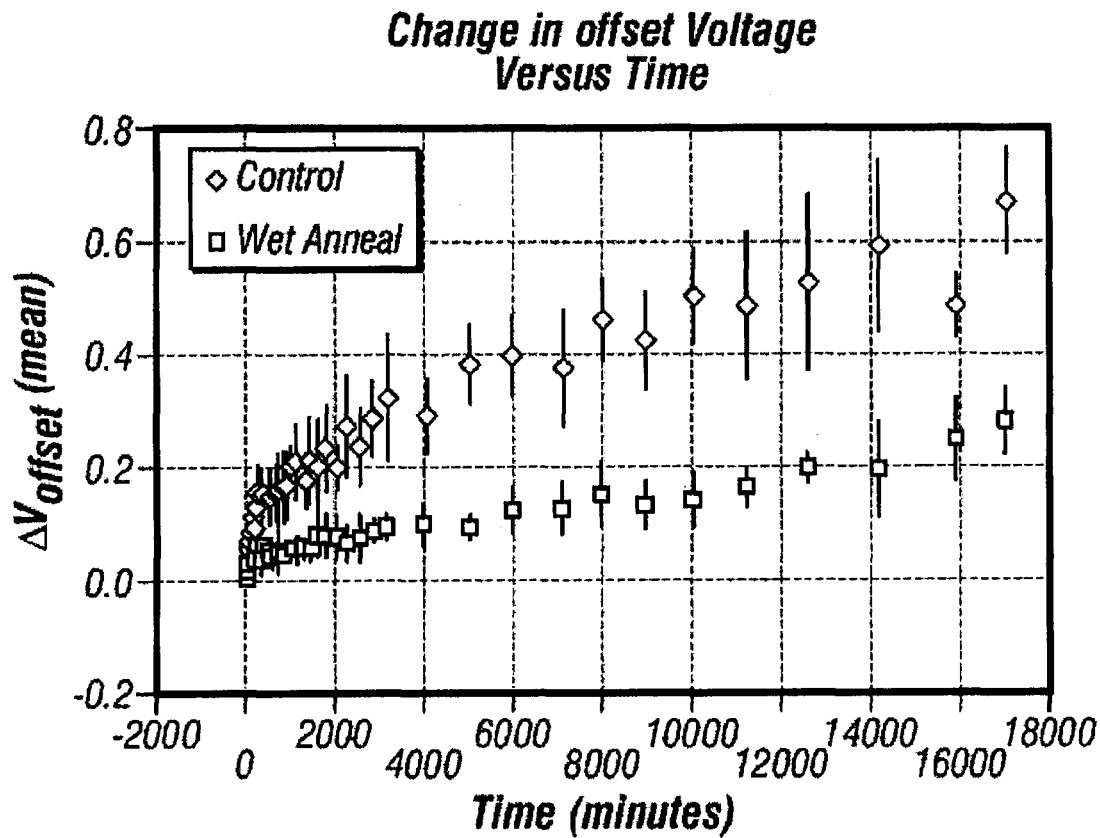

FIG. 14

Signed and Sealed this

Fourth Day of January, 2011

David J. Kappos
*Director of the United States Patent and Trademark Office*

UNITED STATES PATENT AND TRADEMARK OFFICE
CERTIFICATE OF CORRECTION

PATENT NO. : 7,738,158 B2
APPLICATION NO. : 12/163660
DATED : June 15, 2010
INVENTOR(S) : Natarajan et al.

Page 1 of 1

It is certified that error appears in the above-identified patent and that said Letters Patent is hereby corrected as shown below:

On page 2, at column 2, line 25, under Other Publications, please remove "microelectomechanical systesm" and insert therefore, --microelectromechanical systems--.

On page 2, at column 2, line 26, under Other Publications, please remove "Comparision" and insert therefore, --Comparison--.

At column 8, line 5, please remove "respectively" and insert therefore, --respectively.--.

In The Claims:

At column 22, approximately lines 20-21, in Claim 1, after "dielectric; and", please remove "wherein treating the electromechanical device comprises".

Signed and Sealed this
Fifteenth Day of February, 2011

David J. Kappos
*Director of the United States Patent and Trademark Office*